(12) United States Patent  (10) Patent No.: US 7,888,987 B2
Horie  (45) Date of Patent: Feb. 15, 2011

(54) TEMPERATURE COMPENSATION CIRCUIT (75) Inventor: Koji Horie, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 12/323,873

(22) Filed: Nov. 26, 2008

(65) Prior Publication Data

US 2009/0140792 A1 Jun. 4, 2009

(30) Foreign Application Priority Data

Nov. 28, 2007 (JP) ............................. 2007-306980

(51) Int. Cl.
*G05F 3/26* (2006.01)
*H03K 17/14* (2006.01)
(52) U.S. Cl. ....................... 327/513; 327/538; 327/543; 323/907
(58) Field of Classification Search ...................... None
See application file for complete search history.

(56) References Cited

U.S. PATENT DOCUMENTS

| 3,825,778 | A | * | 7/1974 | Ahmed | ....................... 307/117 |
| 5,043,992 | A | * | 8/1991 | Royer et al. | ................... 372/34 |
| 6,091,286 | A | * | 7/2000 | Blauschild | ................... 327/543 |
| 6,683,490 | B2 | * | 1/2004 | Kaminishi | ................... 327/538 |
| 7,119,620 | B2 | | 10/2006 | Pan | |
| 2005/0030105 | A1 | | 2/2005 | Yang et al. | |
| 2005/0264363 | A1 | | 12/2005 | Kang et al. | |
| 2006/0152253 | A1 | | 7/2006 | Kawakami | |
| 2010/0176869 | A1 | * | 7/2010 | Horie et al. | ................... 327/513 |

FOREIGN PATENT DOCUMENTS

JP 2006-191482 7/2006

* cited by examiner

*Primary Examiner*—Lincoln Donovan
*Assistant Examiner*—Terry L Englund
(74) *Attorney, Agent, or Firm*—Turocy & Watson, LLP (57) ABSTRACT

A temperature compensation circuit according to an embodiment includes a bias circuit configured to output a bias current, the bias current having a current value increasing in proportion to absolute temperature, in a low temperature region in which a temperature is lower than a predetermined temperature, and having another current value increasing at a faster rate than the current value increasing in proportion to absolute temperature, in a high temperature region in which the temperature is equal to or greater than the predetermined temperature, and a transistor having a collector connected to a power supply terminal, an emitter which is grounded, and a base supplied with the bias current.

18 Claims, 7 Drawing Sheets

TEMPERATURE COMPENSATION CIRCUIT

CROSS REFERENCE TO RELATED APPLICATIONS

This application is based upon and claims the benefit of priority from the prior Japanese Patent Application No. 2007-306980, filed on Nov. 28, 2007, the entire contents of which are incorporated herein by reference.

BACKGROUND OF THE INVENTION

1. Field of the Invention

The present invention relates to a temperature compensation circuit.

2. Background Art

In a wireless communication device, particularly in a power amplifier for a transmission system (a high-frequency power amplifier), temperature compensation is required.

In general, when a temperature characteristic with respect to a gain of a common-emitter amplifier is desired to be flattened, a current flowing in the amplifier is provided with a temperature characteristic proportional to absolute temperature. Such current is called a PTAT (Proportional To Absolute Temperature) current. Theoretically, it is considered that the temperature characteristic of the gain is thereby to be flattened. For this reason, this method is frequently used in the common-emitter amplifier as a temperature compensation method.

However, in a high frequency signal, the temperature characteristic of the amplifier lowers the gain at a high temperature actually. The lowering of the gain is considered to result from various factors such as Ft (cutoff frequency) of a transistor and increase in resistance of metal. For this reason, conventionally, temperature compensation for the gain at a high temperature has been insufficient.

According to a technique disclosed in JP 2006-191482, the lowering of the gain at a high temperature is prevented by clamping a signal line by a diode to regulate a current flowing through the diode. However, this is not suited for a high-frequency processing circuit because a large loss is brought about in the diode. For this reason, even this conventional art cannot prevent the lowering of the gain at a high temperature.

SUMMARY OF THE INVENTION

An aspect of the present invention is, for example, a temperature compensation circuit including a bias circuit configured to output a bias current, the bias current having a current value increasing in proportion to absolute temperature, in a low temperature region in which a temperature is lower than a predetermined temperature, and having a greater current value than the current value increasing in proportion to absolute temperature, in a high temperature region in which the temperature is equal to or greater than the predetermined temperature, and a transistor having a collector connected to a power supply terminal, an emitter which is grounded, and a base supplied with the bias current.

Another aspect of the present invention is, for example, a temperature compensation circuit including a current source configured to output a first current having a current value proportional to absolute temperature, a bias circuit configured to cause no current to flow, in a low temperature region in which a temperature is lower than a predetermined temperature, and to output a second current having a greater current value than the current value proportional to absolute temperature, in a high temperature region in which the temperature is equal to or greater than the predetermined temperature, a first transistor having an emitter which is grounded, and a collector supplied with an addition of the first and second currents, the emitter of the first transistor outputting a third current, and a second transistor having a collector connected to a power supply terminal, an emitter which is grounded, and a base connected to a base of the first transistor, the cell size of the second transistor being n times as large as the first transistor (n is any positive number), and the emitter of the second transistor outputting a current in which the third current is multiplied by n times.

Another aspect of the present invention is, for example, a temperature compensation circuit including a bias circuit configured to output a bias voltage, the bias voltage having a voltage value increasing in proportion to absolute temperature, in a low temperature region in which a temperature is lower than a predetermined temperature, and having a greater voltage value than the voltage value increasing in proportion to absolute temperature, in a high temperature region in which the temperature is equal to or greater than the predetermined temperature, and a transistor having a source connected to a power supply terminal, a drain which is grounded, and a gate applied with the bias voltage.

DESCRIPTION OF THE EMBODIMENTS

Embodiments of the present invention are described below with reference to the drawings.

(1) First Embodiment

Figure 1:
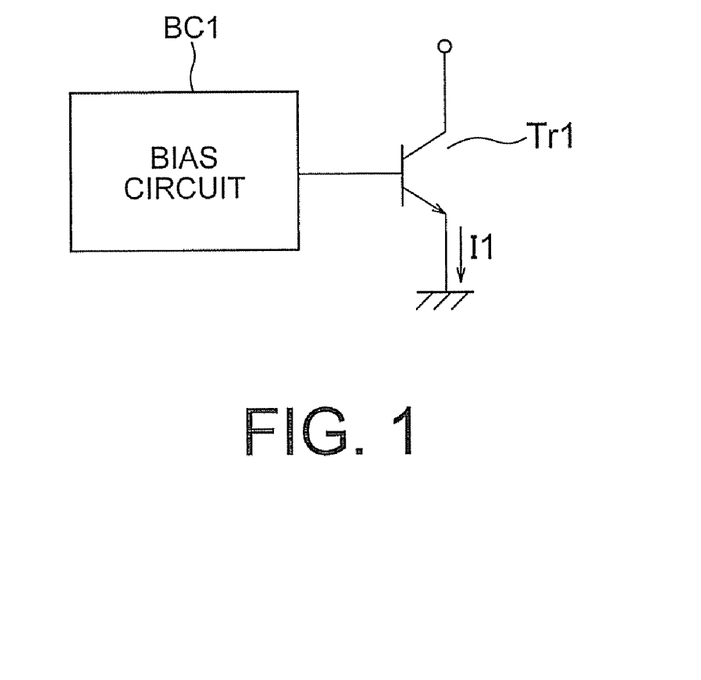
FIG. 1 is a circuit diagram illustrating a configuration of a temperature compensation circuit according to a first embodiment.

FIG. 1 shows a configuration of a temperature compensation circuit according to a first embodiment. This embodiment is described below with reference to FIG. 1.

The compensation circuit of this embodiment includes a bias circuit BC1 and a transistor Tr1. The transistor Tr1 corresponds to a power amplifier, and has a base supplied with an output of the bias circuit BC1, a collector connected to a power supply terminal, and an emitter which is grounded. In this embodiment, an emitter current flowing through the transistor Tr1 is an output current I1.

The output current I1 is controlled by a bias current which is supplied to the base of the transistor Tr1 by the bias circuit BC1. The bias circuit BC1 regulates the bias current so as to flatten the temperature characteristic of the gain, in a range of a performance assurance of a circuit driven by the power amplifier.

A method of regulating the bias current is described with reference to FIG. 2. In a low temperature region in which a temperature is lower than a predetermined temperature "t1", the bias current is a PTAT (Proportional To Absolute Temperature) current so that the current is in proportion to absolute temperature. In a high temperature region in which the temperature is equal to or greater than the predetermined temperature "t1," the bias current gradually increases as indicated by a solid line "I1," rather than proportionally increases as indicated by a dotted line. In the low temperature region, the bias current has a current value increasing in proportion to absolute temperature. In the high temperature region, the bias current has a greater current value than the current value increasing in proportion to absolute temperature.

Figure 3:
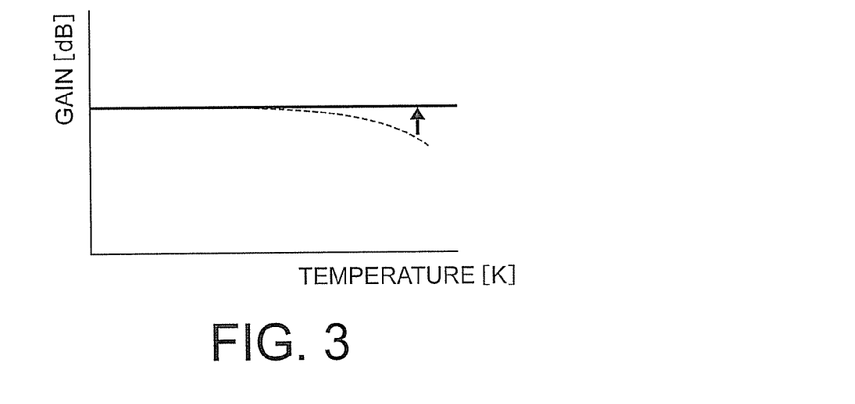
FIG. 3 is a graph illustrating a temperature characteristic of a gain of the temperature compensation circuit according to the first embodiment.

Such a bias current is applied to the transistor Tr1 in the high temperature region to achieve, as illustrated in FIG. 3, the temperature characteristic of the gain flat even in the high temperature region as indicated by a solid line, without decrease in gain with increasing temperature as indicated by a dotted line.

The predetermined temperature "t1" is +25° C., for example. The range of use illustrated in FIG. 2 is −40° C. to +90° C., for example. The range of use is a temperature range in which an LSI provided with the temperature compensation circuit is normally operable.

Figure 12:
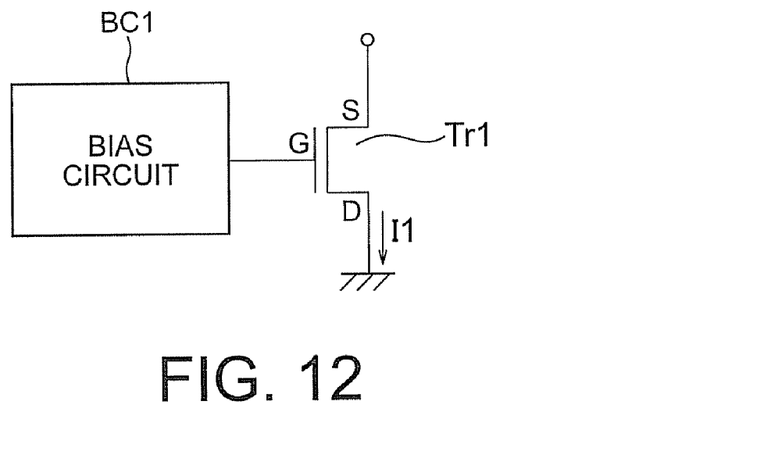
FIG. 12 is a circuit diagram illustrating a temperature compensation circuit according to a modification of the first embodiment.

In this embodiment, the transistor Tr1 is an NPN bipolar transistor. However, the transistor Tr1 may be an nMOS transistor as illustrated FIG. 12. In this case, the base, the collector, and the emitter of the transistor Tr1 in FIG. 1 are replaced with a gate, a source, and a drain of the transistor Tr1 in FIG. 12, respectively. A bias voltage is applied to the gate of the transistor Tr1 in FIG. 12, instead of the bias current. Such a replacement is enabled even in second and third embodiments described later.

(2) Second Embodiment

Figure 4:
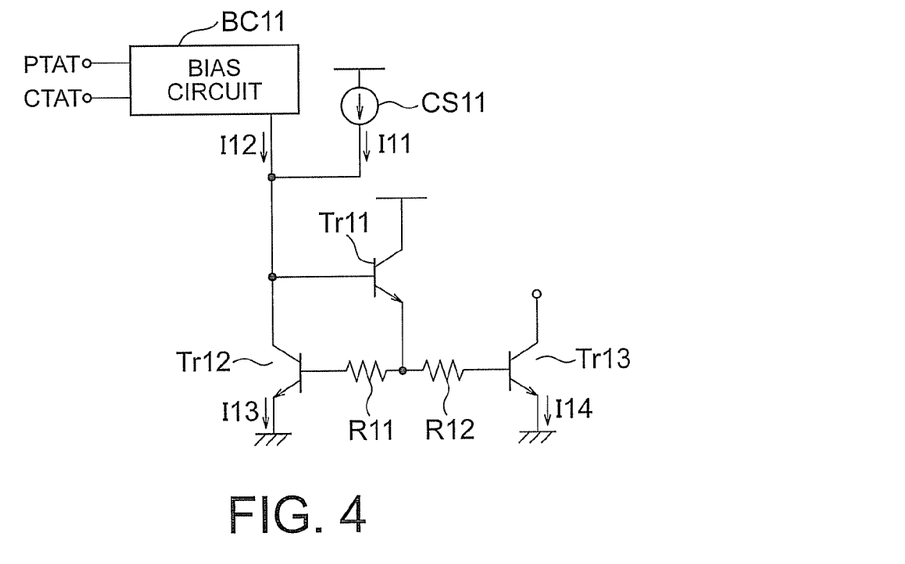
FIG. 4 is a circuit diagram illustrating a configuration of a temperature compensation circuit according to a second embodiment.

FIG. 4 shows a configuration of a temperature compensation circuit according to a second embodiment. This embodiment is described below with reference to FIG. 4.

The compensation circuit of this embodiment includes a bias circuit BC11, a current source CS11, transistors Tr11 and Tr12, resistors R11 and R12, and a transistor Tr13 as a power amplifier. The transistors Tr12 and Tr13 are examples of first and second transistors of the present invention. The transistor Tr11 is an example of a sixteenth transistor of the present invention. The resistors R11 and R12 are examples of fifth and sixth resistors of the present invention.

With respect to the first and second embodiments, the bias circuit BC11, the transistors Tr11 and Tr12, the resistors R11 and R12, and the current source CS11 in the second embodiment correspond to the bias circuit BC11 in the first embodiment.

In this embodiment, an output current from the bias circuit BC11 is a current I12, an output current from the current source CS11 is a current I11, an emitter current flowing through the transistor Tr12 is a current I13, and an emitter current flowing through the transistor Tr13 is a current I14. The currents I11, I12, and I13 are examples of first, second, and third currents of the present invention. The current I14 is an example of a current in which the third current is multiplied by n times (n is any positive number). For example, n is any positive integer larger than 1.

The bias circuit BC11 is supplied by an external input terminal PTAT with a current having a PTAT temperature coefficient increasing in proportion to absolute temperature, and supplied by an external input terminal CTAT (Complementary To Absolute Temperature) with a current having a CTAT temperature coefficient maintaining a constant value independently of absolute temperature. The external input terminal CTAT is an example of a first external input terminal of the present invention. The external input terminal PTAT is an example of a second external input terminal of the present invention.

If a base current to the transistor Tr11 is neglected, the sum of the output current I12 from the bias circuit BC11 and the output current I11 from the current source CS11 is supplied to the collector of the transistor Tr12, and becomes the current I13. In other words, I13=I11+I12. As illustrated in FIG. 4, the collector of the transistor Tr12 is connected to the base of the transistor Tr11, and the emitter of the transistor Tr12 is grounded.

The transistor Tr11 is provided to compensate the base current of the transistors Tr12 and Tr13. The resistor R11 is connected between the base of the transistor Tr12 and the emitter of the transistor Tr11. The resistor R12 is connected between the base of the transistor Tr13 and the emitter of the transistor Tr11. Therefore, the base of the transistor Tr12 is connected to the base of the transistor Tr13 through the resistors R11 and R12.

The resistors R11 and R12 are bias resistors. The ratio of the resistance value of the resistor R11 to that of the resistor R12 is n:1. Further, the ratio of the cell size of the transistor Tr12 to that of the transistor Tr13 is 1:n.

Thereby, there is provided a current mirror circuit in which the ratio of the emitter current I13 flowing through the transistor Tr12 to the emitter current I14 flowing through the transistor Tr13 is 1:n.

As a result, the current I14 flowing through the transistor Tr13 is n*I13 (=I11'+I12). As illustrated in FIG. 4, the collector of the transistor Tr13 is connected to a power supply terminal, and the emitter of the transistor Tr13 is grounded.

Incidentally, the current source CS11 is a PTAT current source outputting a current having a PTAT coefficient. The current is supplied to the transistor Tr12 in the whole temperature region to be multiplied by "n" and supplied to the transistor Tr13.

Figure 5:
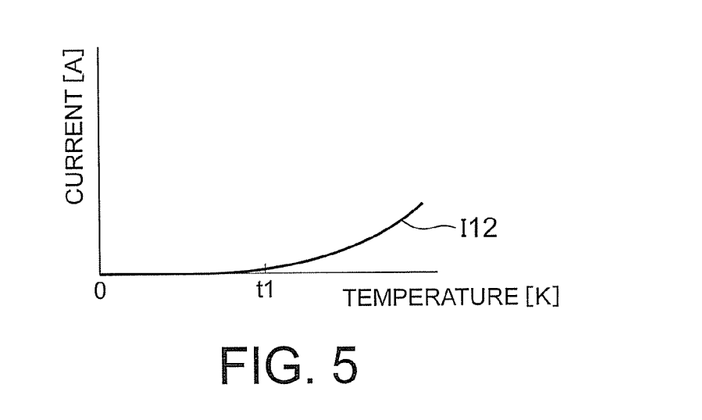
FIG. 5 is a graph illustrating a temperature characteristic of a bias current supplied by a bias circuit according to the second embodiment.

On the other hand, the output current I12 from the bias circuit BC11 is a current which is controlled so as to flow only in a high temperature region in which a temperature is equal to or greater than a predetermined temperature t1, as illustrated in FIG. 5.

The addition of the currents I11 and I12 provides the current I13 having a PTAT coefficient that increases in proportion to absolute temperature in a low temperature region in which the temperature is lower than the predetermined temperature t1, and becoming gradually greater than the PTAT coefficient indicated by the dotted line in the high temperature region.

Figure 2:
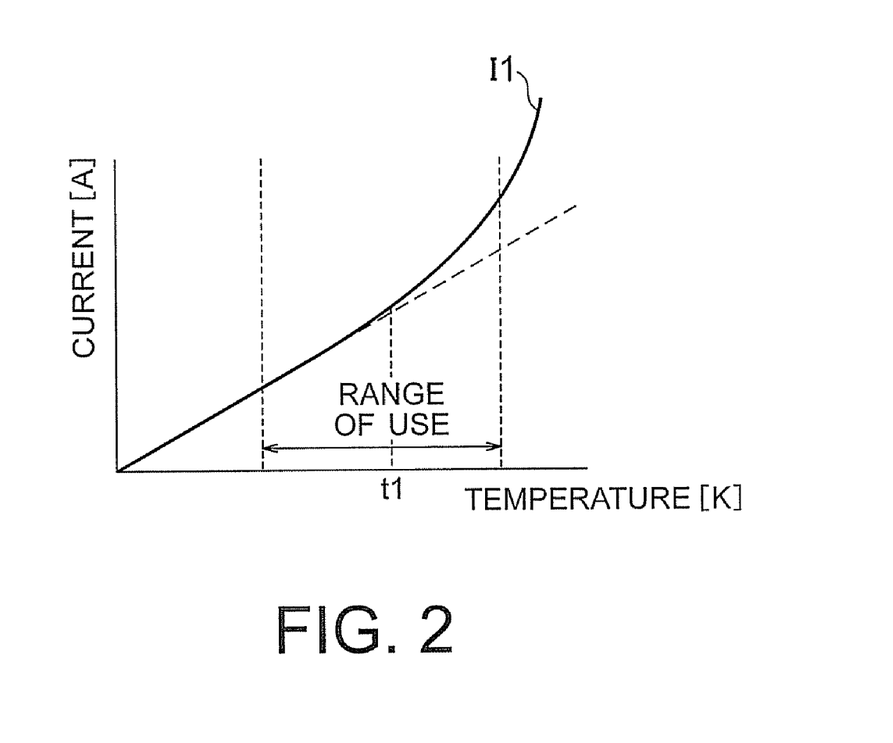
FIG. 2 is a graph illustrating a temperature characteristic of an output current in the first embodiment.

Since the transistors Tr12 and Tr13 form a current mirror circuit, the temperature characteristic of the current I14 flowing through the transistor Tr13 is the same as that illustrated in FIG. 2.

As a result, as illustrated in FIG. 3, the gain of the transistor Tr13 is flattened in the whole temperature region including the high temperature region.

(3) Third Embodiment

Figure 6:
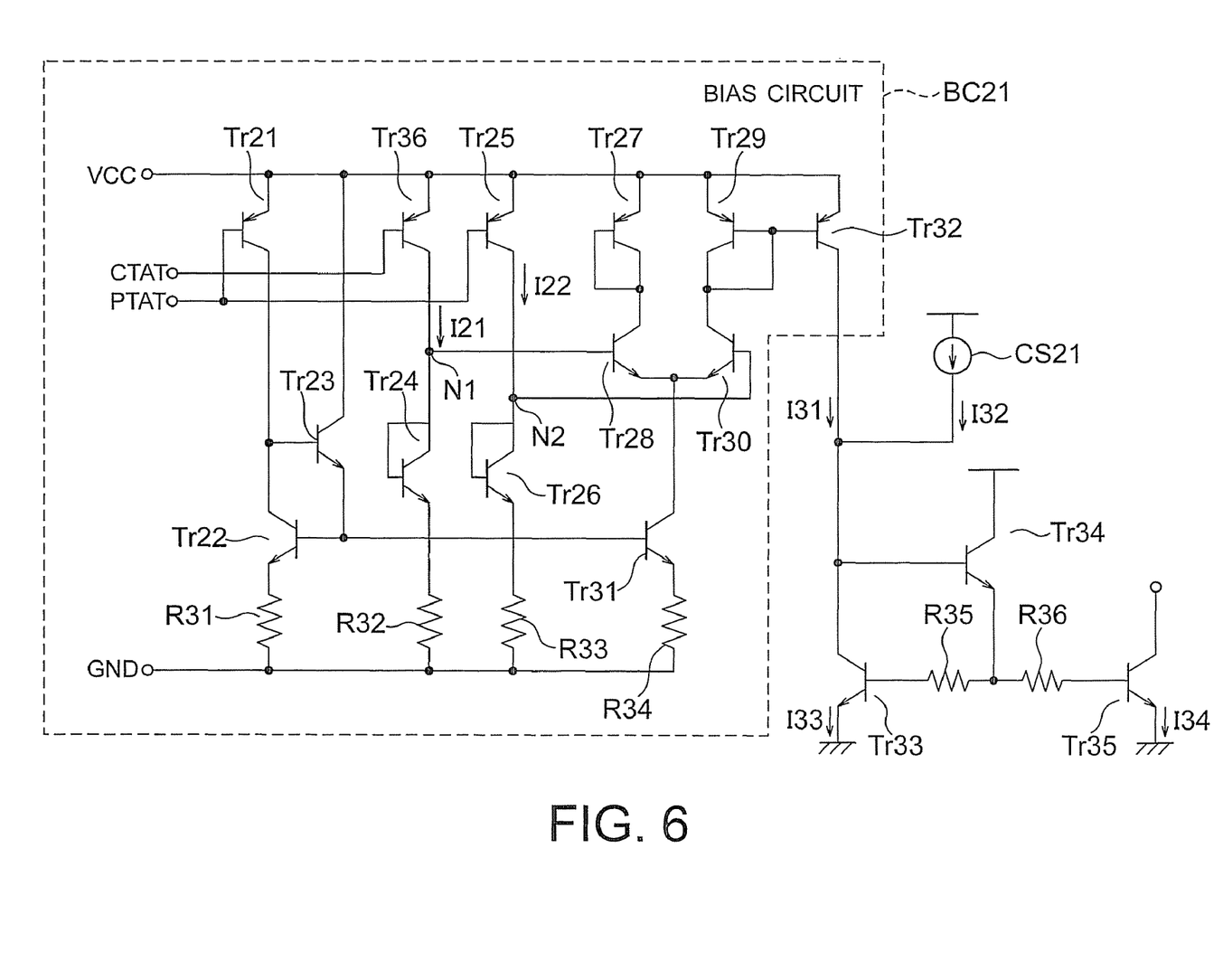
FIG. 6 is a circuit diagram illustrating a configuration of a temperature compensation circuit according to a third embodiment.

FIG. 6 shows a configuration of a temperature compensation circuit according to the third embodiment. This embodiment is described below with reference to FIG. 6.

The compensation circuit of this embodiment includes a bias circuit BC21 having transistors Tr21 to Tr32 and Tr36 and resistors R31 to R34, a current source CS21, transistors Tr33 to Tr35, and resistors R35 to R36.

With respect to the second and third embodiments, the bias circuit BC21 in the third embodiment corresponds to the bias circuit BC11 in the second embodiment. The current source CS21, transistors Tr33 to Tr35, and resistors R35 to R36 correspond to the current source CS11, transistors Tr11 to Tr13, and resistors R11 to R12 in the second embodiment.

The bias circuit BC21 is described below. In this embodiment, there is provided a differential amplifier which includes a transistor Tr27 used for reducing the Early effect, a transistor Tr29 acting as a current mirror of a transistor Tr32, transistors Tr28 and Tr30 provided with differential inputs, and a transistor Tr31 acting as a current source for driving the above transistors. The transistor Tr32 is an example of a seventh transistor of the present invention. The transistors Tr27, Tr29, Tr28, Tr30, and Tr31 are examples of eighth, ninth, tenth, eleventh, and twelfth transistors of the present invention. The resistor R34 connected between the emitter of the transistor Tr31 and a ground terminal, is an example of a fourth resistor of the present invention.

Each of the transistors Tr21, Tr22, and Tr23 is supplied with a bias current to cause a current having a PTAT coefficient to flow through the transistor Tr31. Specifically, a current having a PTAT coefficient is inputted into the base of the transistor Tr21 through the external input terminal PTAT to cause an emitter current having a PTAT coefficient to flow through the transistor Tr22. The transistor Tr23 is provided to compensate for the base current of the transistor Tr22. The transistors Tr21 and Tr22 are examples of third and fourth transistors of the present invention. The current inputted into the base of the transistor Tr21 is an example of a fourth current of the present invention. The emitter current flowing through the transistor Tr22 is an example of a fifth current of the present invention. The transistor Tr23 is an example of a thirteenth transistor of the present invention. The resistor R31 connected between the emitter of the transistor Tr22 and a ground terminal, is an example of a third resistor of the present invention.

A current having the same temperature coefficient as the emitter current flowing through the transistor Tr22, i.e., a current having a PTAT coefficient, flows through the transistor Tr31 forming a current mirror circuit.

A bias current having a CTAT coefficient is supplied into the base of the transistor Tr36 through the external input terminal CTAT to cause the current I21 having a CTAT coefficient to flow through the transistors Tr36 and Tr24 and the resistor R32. The transistor Tr36 and the resistor R32 are examples of a fifth transistor and a first resistor of the present invention. The current supplied to the base of the transistor Tr36 is an example of a sixth current of the present invention. The current I21 is an example of a seventh current of the present invention. The transistor Tr24 is an example of a fourteenth transistor of the present invention.

On the other hand, a bias current having a PTAT coefficient is supplied into the base of the transistor Tr25 through the external input terminal PTAT to cause the current I22 having a PTAT coefficient to flow through the transistors Tr25 and Tr26 and the resistor R33. The resistors R32 and R33 are provided for biasing the bases of the transistors Tr28 and Tr30. The transistor Tr25 and the resistor R33 are examples of a sixth transistor and a second resistor of the present invention. The current supplied to the base of the transistor Tr25 is an example of an eighth current of the present invention. The current I22 is an example of a ninth current of the present invention. The transistor Tr26 is an example of a fifteenth transistor of the present invention.

The electric potential at a node N1 in which the current I21 having the CTAT coefficient flows and the electric potential at a node N2 in which the current I22 having the PTAT coefficient flows are inputted to the bases of the transistors Tr28 and Tr30 and compared each other. Thereby, the temperature characteristics of the voltages between the bases and the emitters of the transistors Tr28 and Tr30 (Vbe) are compensated so as to have CTAT and PTAT coefficients respectively. The node N1 lies between the collector of the transistor Tr36 and the collector (and the base) of the transistor Tr24. The node N2 lies between the collector of the transistor Tr25 and the collector (and the base) of the transistor Tr26.

The transistor Tr27 is provided for applying the collector of the transistor Tr28 with a voltage between the collector and the emitter thereof (Vce) to reduce the Early effect of the transistor Tr30.

The transistors Tr21, Tr36, Tr25, Tr27, Tr29, and Tr32 illustrated in FIG. 6 are PNP bipolar transistors. The above transistors may be pMOSFETs. In this case, the base, collector, and emitter of each transistor are replaced with a gate, a source, and a drain respectively, as is the case with the first embodiment.

Figure 7:
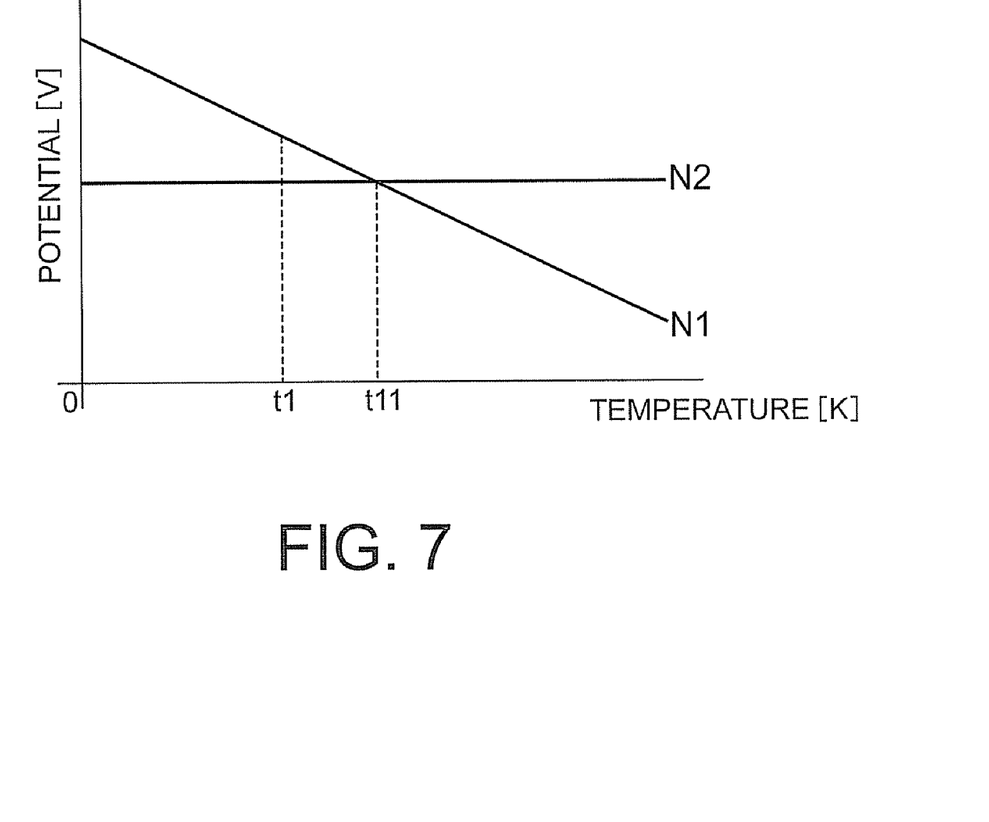
FIG. 7 is a graph illustrating temperature characteristics of electric potentials at nodes N1 and N2 in the third embodiment.

Since the current I21 flowing through the node N1 has the CTAT coefficient, a temperature characteristic of the electric potential is such that the electric potential at the node N1 monotonously decreases with increasing temperature, as indicated by a straight line N1 in FIG. 7, due to the influence of the voltage Vbe between the base and the emitter of the transistor Tr24 and the resistor R32. On the other hand, since the current I22 flowing through the node N2 has the PTAT coefficient, a temperature characteristic of the electric potential at the node N2 is flat and maintains a constant value independently of temperature, as indicated by a straight line N2 in FIG. 7, due to the influence of the voltage Vbe between the base and the emitter of the transistor Tr26 and the resistor R33. In a low temperature region in which a temperature is lower than a predetermined temperature t11, the electric potential at the node N1 is higher than that at the node N2. At the predetermined temperature t11, the electric potential at the node N1 is equal to that at the node N2. In a high temperature region in which the temperature is equal to or greater than the predetermined temperature t11, the electric potential at the node N2 is greater than that at the node N1.

As a result, in the low temperature region in which the temperature is lower than the predetermined temperature t1, the electric potential at the node N1 is sufficiently higher than that at the node N2, so that a current flows through the transistor Tr28, but does not flow through the transistor Tr30. Therefore, a current does not flow through the transistor Tr29, and does not flow through the transistor Tr32 forming a current mirror circuit with the transistor Tr29. Thereby, a current I33 flowing through the transistor Tr33 reduces only to the current I32 outputted from the current source CS21.

When the temperature reaches the predetermined temperature t1, a very small amount of current starts flowing through the transistor Tr30. Therefore, a very small amount of current flows through the transistor Tr29. Then, a very small amount of current starts flowing also through the transistor Tr32. A current I31 starts to be added to the current I33 flowing through the transistor Tr33.

At a predetermined temperature t11 higher than the predetermined temperature t1, the electric potentials at the nodes N1 and N2 are equal to each other, so that the same amount of current flows though the transistors Tr28 and Tr30.

In the high temperature region in which the temperature is higher than a predetermined temperature t2, the node N2 is higher than the node N1 in electric potential, so that more current flows through the transistor Tr30 than through the transistor Tr28. A current equal to the current flowing through the transistor Tr30 flows through the transistor Tr29, and also through the transistor Tr32 forming the current mirror circuit with the transistor Tr29. Thereby, the current I33 flowing through the transistor Tr33 is equal to the sum of the current I31 and the current I32 outputted from the current source CS21.

Figure 8:
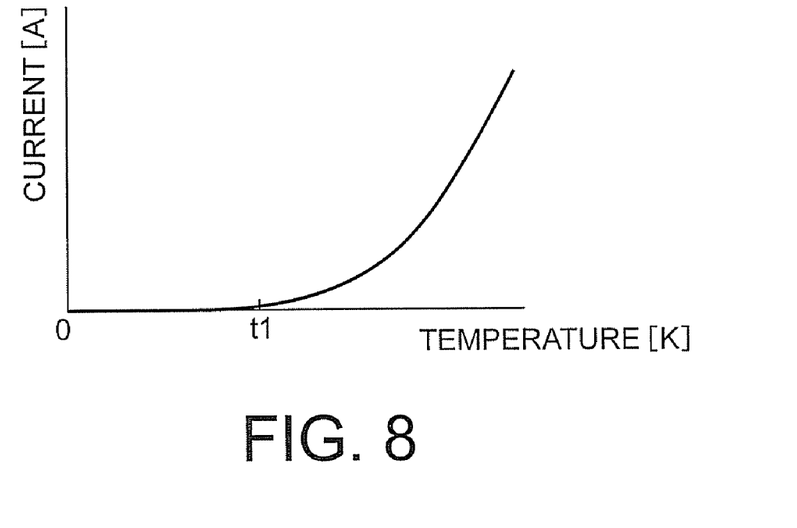
FIG. 8 is a graph illustrating a temperature characteristic of a current flowing through an output transistor Tr32 of a bias circuit in the third embodiment.

FIG. 8 is the temperature characteristic of the transistor Tr32. In the low temperature region in which the temperature is lower than the predetermined temperature t1, a current does not flow. At a temperature equal to or greater than the predetermined temperature t1, a current increases with temperature. The current I31 flowing through the transistor Tr32 is n times as much as the current flowing through the transistor Tr30.

Figure 9:
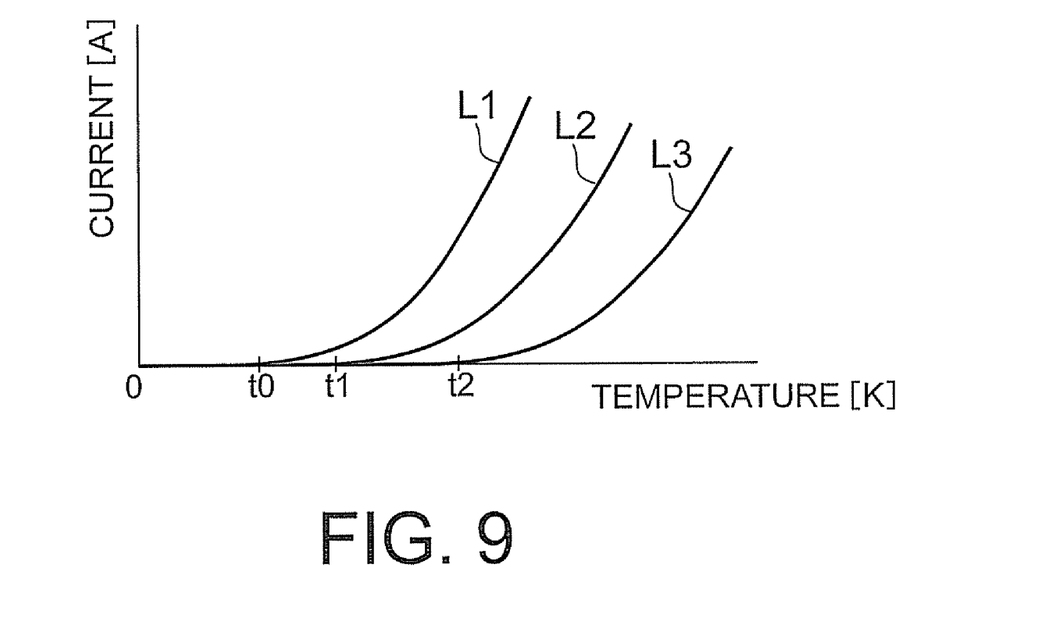
FIG. 9 is a graph illustrating that a resistor R32 varies the temperature characteristic of the current flowing through the output transistor Tr32 of the bias circuit in the third embodiment.

As illustrated in FIG. 9, the current flowing through the transistor Tr30 can be adjusted by varying the value of the bias resistor R32 connected to the emitter of the transistor Tr24 which determines the electric potential of the transistor Tr28. For example, the bias resistor R32 which realizes the temperature characteristic of the transistor Tr32 indicated by a curve L2 is assumed to be 100%.

When the bias resistor R32 is set to 90%, the temperature characteristic of the transistor Tr32 is shown by a curve L1, and a current starts flowing at a lower temperature t0. When the bias resistor R32 is set to 110%, the temperature characteristic of the transistor Tr32 is shown by a curve L3, and a current does not flow until a temperature reaches a higher temperature t2. The increasing rate of current is the same among the curves L1, L2, and L3. In this way, horizontal-direction adjustment in the graph illustrating the temperature characteristic of the transistor Tr32 is performed by varying the value of the bias resistor.

The adjustment of the bias resistor may be performed by varying the value of the resistor R33 connected to the emitter of the transistor Tr26 instead of the resistor R32, or by varying the values of both resistors R32 and R33.

Figure 10:
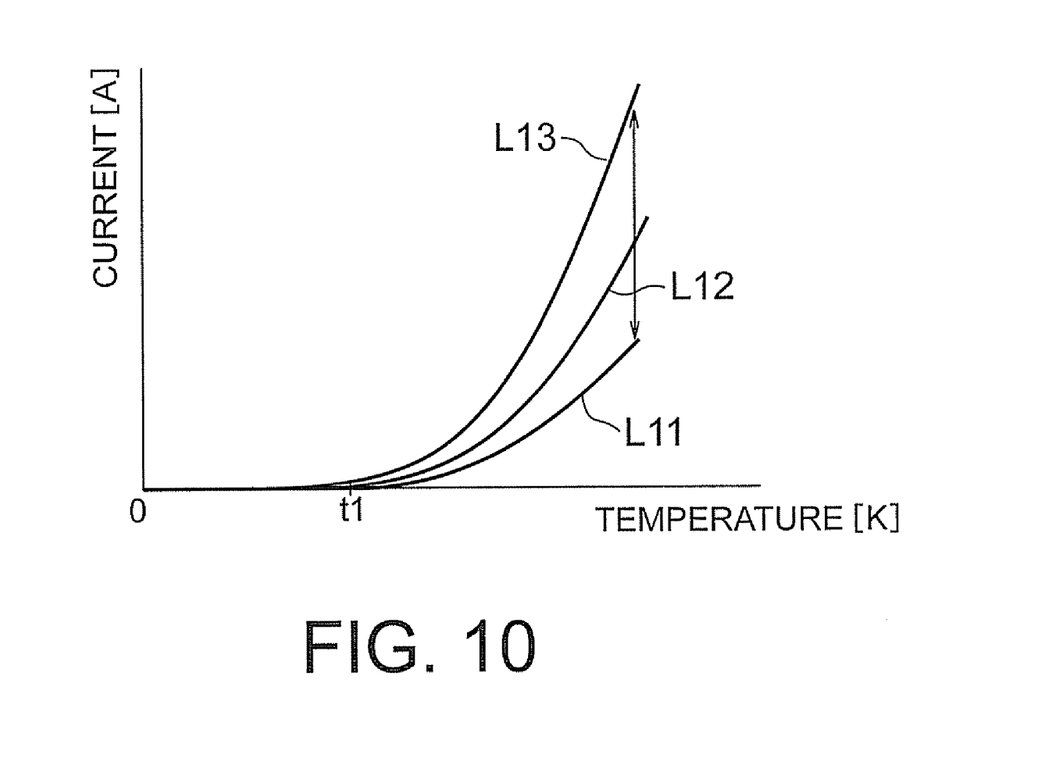
FIG. 10 is a graph illustrating that the cell size of the transistor Tr32 varies the temperature characteristic of the current flowing through the output transistor Tr32 of the bias circuit in the third embodiment.

On the other hand, vertical-direction adjustment in the graph, i.e., adjustment of an increasing rate of a current in the transistor Tr32, is performed by adjusting the size of the bias resistor Tr32. The cell size of the transistor Tr32 having the temperature characteristic indicated by a curve L12 illustrated in FIG. 10 is assumed to be 100%. When the cell size is 70%, the temperature characteristic of the transistor Tr32 is shown by a curve L11, and the increasing rate of the current lowers. On the other hand, when the cell size of the transistor Tr32 is 130%, the increasing rate of the current increases as shown by a curve L13. In any case, the current starts flowing through the transistor Tr32 substantially at the temperature t1.

The current I33 flowing through the transistor Tr33 has the temperature characteristic illustrated in FIG. 2. In other words, at a temperature equal to or greater than the predetermined temperature t1, the current I31 is added to the current I32 increasing with temperature.

The addition of the current I31 flattens the gain of the transistor Tr35 even in the high temperature region in which a temperature is equal to or greater than the predetermined temperature t1, as illustrated in FIG. 3.

Figure 11:
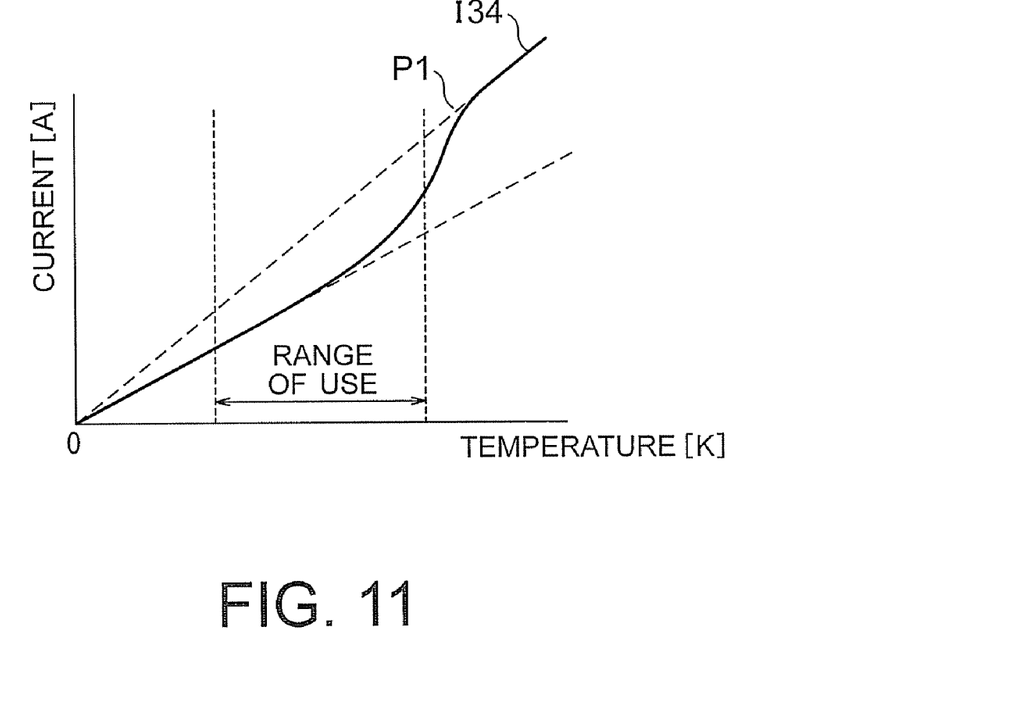
FIG. 11 is a graph illustrating a temperature characteristic of a current supplied to a transistor Tr35 in the third embodiment.

Although a current I34 flowing through the transistor Tr35 increases in the high temperature region, its increase is suppressed as indicated by a point P1 to prevent thermal runaway. The current I34 has a temperature characteristic illustrated in FIG. 11, and has a PTAT coefficient in the high temperature region in which a temperature is higher than the temperature indicated by a point P1. Increase of the current I34 is limited by the cell size of the transistor Tr17.

The current flowing through the transistor Tr32 is determined by the difference between currents flowing through the transistors Tr28 and Tr30. The sum of currents flowing through the transistors Tr28 and Tr30 is limited by the transistor Tr31. Saturation of the current flowing through the transistor Tr31 suppresses the thermal runaway of the transistor Tr32. This avoids a phenomenon that a current extremely increases with temperature, which prevents the thermal runaway.

In this embodiment, as illustrated in FIG. 6, the current from the external input terminal PTAT is supplied to the base of the transistors Tr21 and Tr25. On the other hand, as illustrated in FIG. 13, a current from an external input terminal PTAT1 may be supplied to the transistor Tr21, and a current from an external input terminal PTAT2 may be supplied to the base of the transistor Tr25.

Figure 13:
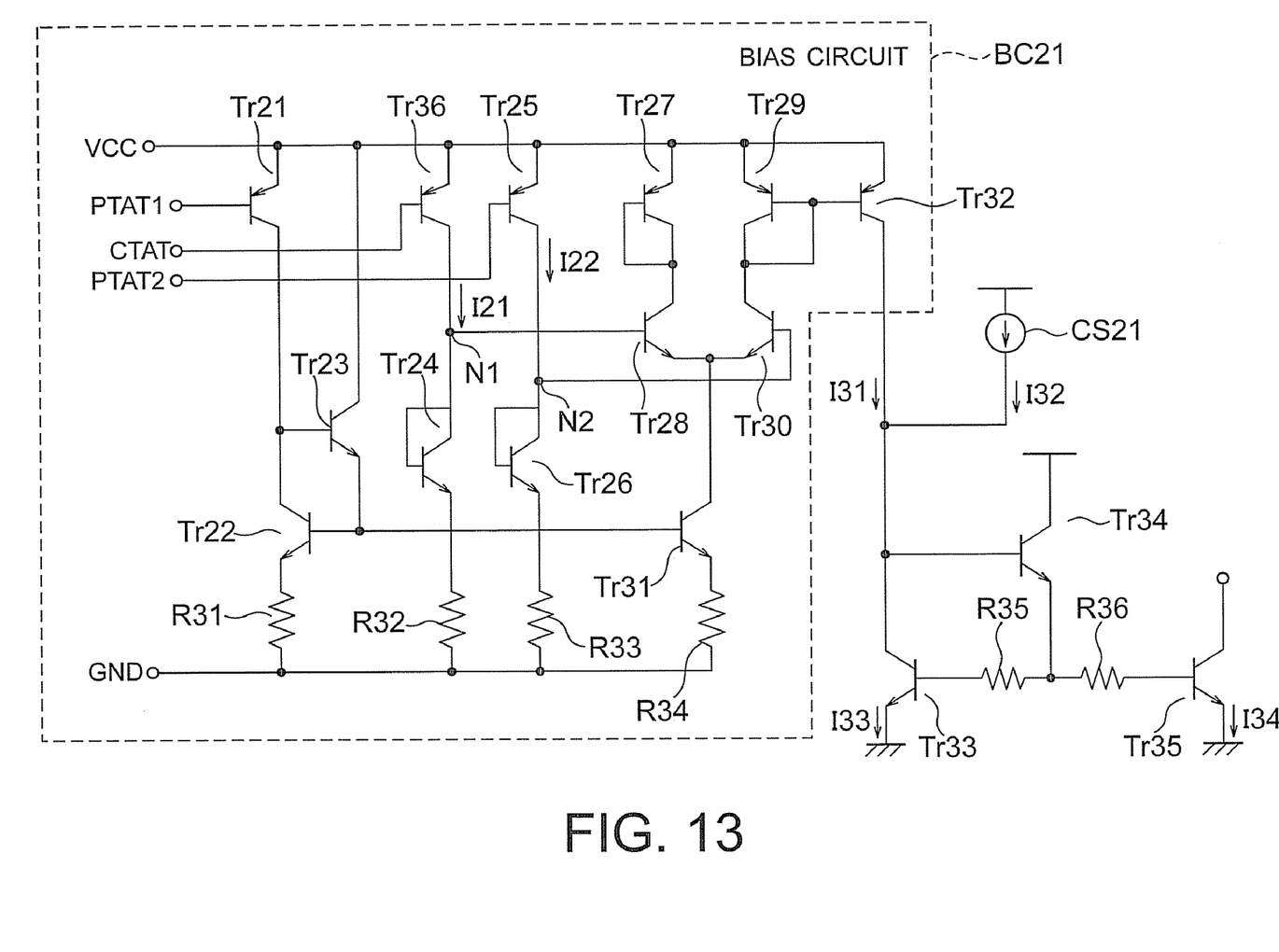
FIG. 13 is a circuit diagram illustrating a temperature compensation circuit according to a modification of the third embodiment.

The bias circuit BC21 in FIG. 13 is supplied by the external input terminal CTAT with a current having a CTAT coefficient maintaining a constant value independently of absolute temperature. The bias circuit BC21 is supplied by the external input terminal PTAT1 with a current having a PTAT coefficient increasing in proportion to absolute temperature. The bias circuit BC21 is supplied by the external input terminal PTAT2 with the current having a PTAT coefficient increasing in proportion to absolute temperature. The external input terminal CTAT is an example of a first external input terminal of the present invention. The external input terminal PTAT1 is an example of a second external input terminal of the present invention. The external input terminal PTAT2 is an example of a third external input terminal of the present invention.

The bias circuit BC21 in FIG. 13 is supplied by the external input terminals PTAT1 and PTAT2 with the currents having current values independent from each other. For this reason, the bias circuit BC21 in FIG. 13 can independently control the current supplied to the base of the transistor Tr21 and the current supplied to the base of the transistor Tr25. Thereby, the bias circuit BC21 in FIG. 13 can independently control the PTAT coefficient of the current flowing the transistor Tr31 and the PTAT coefficient of the current flowing the transistor Tr25.

As described above, according to embodiments of the present invention, temperature compensation of gain of a high-frequency signal processing circuit can be performed even in the high temperature region.

Although examples of specific aspects of the present invention are described above using the first to third embodiments of the present invention, the present invention is not limited to these embodiments.

The invention claimed is:

1. A temperature compensation circuit comprising:
    a bias circuit configured to output a bias current, the bias current having a current value increasing in proportion to absolute temperature, in a low temperature region in which a temperature is lower than a predetermined temperature, and having another current value increasing at a faster rate than the current value increasing in proportion to absolute temperature, in a high temperature region in which the temperature is equal to or greater than the predetermined temperature; and
    a transistor having a collector connected to a power supply terminal, an emitter which is grounded, and a base supplied with the bias current,
    wherein the bias circuit comprises:
    a resistor configured to adjust the predetermined temperature by a resistance value of the resistor; and
    a further transistor configured to adjust the rate of the bias current in the high temperature region by a cell size of the further transistor.

2. A temperature compensation circuit comprising:
    a current source configured to output a first current having a current value proportional to absolute temperature;
    a bias circuit configured to cause no current to flow, in a low temperature region in which a temperature is lower than a predetermined temperature, and to output a second current having another current value increasing with increasing absolute temperature, in a high temperature region in which the temperature is equal to or greater than the predetermined temperature;
    a first transistor having an emitter which is grounded, and a collector supplied with an addition of the first and second currents, the emitter of the first transistor outputting a third current; and
    a second transistor having a collector connected to a power supply terminal, an emitter which is grounded, and a base connected to a base of the first transistor, the cell size of the second transistor being n times as large as the first transistor (n is any positive number), and the emitter of the second transistor outputting a current in which the third current is multiplied by n times.

3. The compensation circuit according to claim 2, wherein the bias circuit comprises:
    a third transistor having an emitter connected to a power supply terminal, a base supplied with a fourth current having a first current value proportional to absolute temperature, and a collector outputting a fifth current;
    a fourth transistor having a collector supplied with the fifth current, and an emitter which is grounded and outputs the fifth current;
    a fifth transistor having an emitter connected to the power supply terminal, a base supplied with a sixth current having a current value independent of absolute temperature, and a collector outputting a seventh current;
    a sixth transistor having an emitter connected to the power supply terminal, a base supplied with an eighth current having a second current value proportional to absolute temperature, and a collector outputting a ninth current;
    a first resistor connected between the collector of the fifth transistor and a ground terminal;
    a second resistor connected between the collector of the sixth transistor and the ground terminal;
    a differential amplifier to which a electric potential at the collector of the fifth transistor and a second electric potential at the collector of the sixth transistor are inputted, and which provides an output according to the difference between the electric potentials; and
    a seventh transistor having an emitter connected to the power supply terminal, a collector connected to the collector of the first transistor, and a base supplied with the output of the differential amplifier, the collector of the seventh transistor outputting the second current.

4. The compensation circuit according to claim 3, wherein,
    the predetermined temperature at which the second current outputted from the seventh transistor starts flowing, is adjusted by adjusting at least any one of a resistance value of the first resistor and a resistance value of the second resistor, and
    an increase of the second current due to an increase in temperature, is adjusted by adjusting a cell size of the seventh transistor, with respect to the second current outputted in the high temperature region.

5. The compensation circuit according to claim 4, wherein the differential amplifier comprises:
    an eighth transistor having an emitter connected to the power supply terminal;
    a ninth transistor having an emitter connected to the power supply terminal, and a base and a collector connected to the base of the seventh transistor;
    a tenth transistor having a collector connected to a base and a collector of the eighth transistor, and a base applied with the first electric potential at the collector of the fifth transistor;
    an eleventh transistor having a collector connected to the base and collector of the ninth transistor, and a base applied with the second electric potential at the collector of the sixth transistor; and
    a twelfth transistor having a collector connected to emitters of the tenth and eleventh transistors, and a base connected to a base of the fourth transistor;
    wherein the sum of the amounts of currents flowing through the tenth and the eleventh transistors is limited by the twelfth transistor, so that the amount of current flowing through the seventh transistor is limited.

6. The compensation circuit according to claim 3, wherein the sixth current is supplied through a first external input terminal, and
    the fourth and eighth currents are supplied through a second external input terminal.

7. The compensation circuit according to claim 3, wherein the sixth current is supplied through a first external input terminal,
    the fourth current is supplied through a second external input terminal, and
    the eighth current is supplied through a third external input terminal.

8. The compensation circuit according to claim 7, wherein,
    the current value of the current supplied through the second external input terminal and the current value of the current supplied through the third external input terminal are independent from each other.

9. The compensation circuit according to claim 3, wherein,
    the first electric potential at the collector of the fifth transistor decreases with increasing temperature, and the second electric potential at the collector of the sixth transistor is independent of temperature.

10. The compensation circuit according to claim 9, wherein,
the first electric potential at the collector of the fifth transistor is equal to the second electric potential at the collector of the sixth transistor, at a higher predetermined temperature than the predetermined temperature.

11. The compensation circuit according to claim 5, wherein the bias circuit further comprises:
a thirteenth transistor having a collector connected to the power supply terminal, a base connected to the collectors of the third and fourth transistors, and an emitter connected to the base of the fourth transistor.

12. The compensation circuit according to claim 11, wherein the bias circuit further comprises:
a fourteenth transistor having a base and a collector connected to the collector of the fifth transistor, and an emitter connected to the first resistor; and
a fifteenth transistor having a base and a collector connected to the collector of the sixth transistor, and an emitter connected to the second resistor.

13. The compensation circuit according to claim 12, wherein,
the base of the tenth transistor is applied with the first electrical potential at a node between the collector of the fifth transistor and the collector of the fourteenth transistor, and
the base of the eleventh transistor is applied with the second electrical potential at a node between the collector of the sixth transistor and the collector of the fifteenth transistor.

14. The compensation circuit according to claim 13, wherein the bias circuit further comprises:
a third resistor connected between the emitter of the fourth transistor and the ground terminal; and
a fourth resistor connected between the emitter of the twelfth transistor and the ground terminal.

15. The compensation circuit according to claim 14, further comprising:
a sixteenth transistor having a base connected to the collector of the first transistor.

16. The compensation circuit according to claim 15, further comprising:
a fifth resistor connected between the base of the first transistor and an emitter of the sixteenth transistor; and
a sixth resistor connected between the base of the second transistor and the emitter of the sixteenth transistor.

17. The compensation circuit according to claim 16, wherein,
a ratio of the value of the fifth resistor to the value of the sixth resistor is n to 1.

18. A temperature compensation circuit comprising:
a bias circuit configured to output a bias voltage, the bias voltage having a voltage value increasing in proportion to absolute temperature, in a low temperature region in which a temperature is lower than a predetermined temperature, and having another voltage value increasing at a faster rate than the voltage value increasing in proportion to absolute temperature, in a high temperature region in which the temperature is equal to or greater than the predetermined temperature; and
a transistor having a source connected to a power supply terminal, a drain which is grounded, and a gate applied with the bias voltage,
wherein the bias circuit comprises:
a resistor configured to adjust the predetermined temperature by a resistance value of the resistor; and
a further transistor configured to adjust the rate of the bias voltage in the high temperature region by a cell size of the further transistor.

* * * * *